United States Patent

Shimizu et al.

[11] Patent Number: 5,931,967
[45] Date of Patent: Aug. 3, 1999

[54] METHOD AND APPARATUS FOR DETECTION OF ERRORS IN MULTIPLE-WORD COMMUNICATIONS

[75] Inventors: Takeshi Shimizu, San Jose; Thomas Martin Wicki, Palo Alto, both of Calif.; Patrick James Helland, Redmond, Wash.

[73] Assignee: Fujitsu, Ltd., Japan

[21] Appl. No.: 08/603,923

[22] Filed: Feb. 22, 1996

[51] Int. Cl.$^6$ ..................................................... G06F 11/00
[52] U.S. Cl. ........................... 714/799; 714/807; 714/819
[58] Field of Search ................................. 371/48, 54, 67.1, 371/57.1, 60, 65, 37.1, 37.4, 37.6, 37.7; 348/420; 714/799, 807, 819

[56] References Cited

U.S. PATENT DOCUMENTS

| | | | |
|---|---|---|---|
| 4,271,520 | 6/1981 | Coombes et al. | 371/42 |
| 5,068,854 | 11/1991 | Chandran et al. | 371/37.1 |
| 5,422,894 | 6/1995 | Abe et al. | 371/37.4 |
| 5,448,296 | 9/1995 | Music | 348/420 |
| 5,598,422 | 1/1997 | Longwell et al. | 371/37.1 |

OTHER PUBLICATIONS

Subrahmanyam Dravida, "Error Detection and Correction Options for Data Services in B–ISDN", IEEE Journal on Selected Areas in Communications, vol. 9, No. 9, Dec. 1, 1991.

*Primary Examiner*—Phung M. Chung
*Attorney, Agent, or Firm*—Fenwick & West LLP

[57] ABSTRACT

A method and apparatus colors the conventional error codes of each word of a multiword transmission to facilitate the detection of words which are out of order or not part of the transmission, without affecting the data in the word. A 1-bit by n-bit matrix is assembled using the header word, and zeros for the header of the multiword transmission, or the data word, error code, if any, an identifier portion of the header word and zeros for each data word, and the 1-bit by n-bit matrix is multiplied by an n-bit by m-bit matrix assembled from a conventional error coding matrix and other matrices. The result either produces an error code to be sent with the header or data, or a check code to be verified as all zeros to indicate the absence of bit errors within the header or data word, and that the word is in the proper packet and in the proper sequence within the packet. An alternate method and apparatus colors the data portion of certain words of multiword transmissions to provide an alternate manner of facilitating the detection of words which are out of order or not part of the transmission.

38 Claims, 10 Drawing Sheets

METHOD AND APPARATUS FOR DETECTION OF ERRORS IN MULTIPLE-WORD COMMUNICATIONS

CROSS-REFERENCES TO RELATED APPLICATIONS

The subject matter of this application is related to the subject matter of the following applications:

application Ser. No. 08/605,677, attorney docket number 2268, entitled "ASYNCHRONOUS PACKET SWITCHING" filed on Feb. 22, 1996, by Thomas M. Wicki, Patrick J. Helland, Takeshi Shimizu, Wolf-Dietrich Weber, and Winfried W. Wilcke;

application Ser. No. 08/605,676, attorney docket number 2269, entitled "SYSTEM AND METHOD FOR DYNAMIC NETWORK TOPOLOGY EXPLORATION" filed on Feb. 22, 1996, by Thomas M. Wicki, Patrick J. Helland, Wolf-Dietrich Weber, and Winfried W. Wilcke;

application Ser. No. 08/603,926, attorney docket number 2270, entitled "LOW LATENCY, HIGH CLOCK FREQUENCY PLESIOASYNCHRONOUS PACKET-BASED CROSSBAR SWITCHING CHIP SYSTEM AND METHOD" filed on Feb. 22, 1996, by Thomas M. Wicki, Jeffrey D. Larson, Albert Mu, and Raghu Sastry;

application Ser. No. 08/603,880, attorney docket number 2271, entitled "METHOD AND APPARATUS FOR COORDINATING ACCESS TO AN OUTPUT OF A ROUTING DEVICE IN A PACKET SWITCHING NETWORK" filed on Feb. 22, 1996, by Jeffrey D. Larson, Albert Mu, and Thomas M. Wicki;

application Ser. No. 08/604,920, attorney docket number 2272, entitled "CROSSBAR SWITCH AND METHOD WITH REDUCED VOLTAGE SWING AND NO INTERNAL BLOCKING DATA PATH" filed on Feb. 22, 1996, by Albert Mu and Jeffrey D. Larson;

application Ser. No. 08/603,913, attorney docket number 2274, entitled "A FLOW CONTROL PROTOCOL SYSTEM AND METHOD" filed on Feb. 22, 1996, by Thomas M. Wicki, Patrick J. Helland, Jeffrey D. Larson, Albert Mu, Raghu Sastry and Richard L. Schober, Jr.;

application Ser. No. 08/603,911, attorney docket number 2275, entitled "INTERCONNECT FAULT DETECTION AND LOCALIZATION METHOD AND APPARATUS" filed on Feb. 22, 1996, by Raghu Sastry, Jeffrey D. Larson, Albert Mu, John R. Slice, Richard L. Schober, Jr. and Thomas M. Wicki;

application Ser. No. 08/603,882, attorney docket number 2278, entitled "CLOCKED SENSE AMPLIFIER WITH POSITIVE SOURCE FEEDBACK" filed on Feb. 22, 1996, by Albert Mu;

all of the above applications are incorporated herein by reference in their entirety.

FIELD OF INVENTION

The present invention relates to error detection and more specifically to error detection of multiple-word communications.

BACKGROUND OF INVENTION

Communications systems such as packet switched networks allow devices to transmit and receive information. Referring now to FIG. 1A, a conventional packet switched network is shown. Each conventional device 10, 12, 16, 18 can act as both a sending site and a receiving site to send and receive data from the other devices 10, 12, 16, 18 in the network. Conventional router 14 receives data in the form of packets from each sending device 10, 12, 16, 18 and routes it to the proper receiving device 10, 12, 16, 18 according to header information contained in the packet.

Header information may contain an identifier containing routing information and a "nearly unique" packet number in addition to other information. The nearly unique packet number may be an identifier which has a large number of bits randomly or sequentially selected by the sending site, making the identifier also nearly unique. Although the identifier is unlikely to be the same as the identifier of the header from another packet sent to the router 14 at the same time, there is a small probability that two headers being sent to the router 14 could have the same identifier.

Referring now to FIG. 1B, a conventional packet 102 is shown. Header 110 is followed by a number of words of data 112, 114, 116 in a certain order. The header 110 in FIG. 1B has an identifier 130 in bits 80 through 115, though other sizes and bit positions of identifiers are possible. The identifier 130 contains "nearly unique" information Each data word 112, 114, 116 and the header 110 has an appended error code 120, 122, 124, 126, which can be used to detect and even correct errors in the remainder of the individual words of data 112, 114, 116 or header 110 information. For example, each word 110, 112, 114, 116 in the packet 102 may contain 128 bits of data or header information and an 8 bit error code 120, 122, 124, 126 to create 136 bit words for transmission at a sending site. The error codes 120, 122, 124, 126 are checked against the data 170 at the receiving site to detect or correct errors within the data portion 170 of each word 110, 112, 114, 116. Once the data is determined to be correct, the error codes 120, 122, 124, 126 may be removed from the data portions 170 by the receiving site, and the data portions 170 of each word 110, 112, 114, 116 are ready for use by the receiving site.

Conventional error detection and error detection and correction codes may detect and correct errors related to a single word of a digital transmission. Many methods may be used to implement various error detection codes and error detection and correction codes. The methods described in Rao T. R. N. & E Fujiwara, *Error-Control Coding for Computer Systems* (Prentice Hall, 1989), D. K. Pradhan & J. J. Stiffler, *Error-Correcting Codes and Self Checking Circuits*, 27–37 (Computer, Vol 13 No.3 March, 1980), H. Imai *Essentials of Error-Control-Coding Techniques* (Academic Press, 1990) or E. Fujiwara et. al *Error-Control Coding in Computers*, 63–72 (Computer July 1990) may be used to detect certain errors within the data portion of a word 110, 112, 114, 116.

Error codes 120, 122, 124, 126 may be generated using a binary matrix multiplication process which multiplies the data portion 170 of a word 110, 112, 114, 116 with a matrix which is predefined by the designer of the error code. For example, error codes set forth above are generated by binary matrix multiplication of the data portion 170 of each word 110, 112, 114, 116 and the matrix set forth in Appendix A. Each binary matrix product of the matrix of Appendix A and each word 110, 112, 114, 116 is the error code portion 120, 122, 124, 126, respectively to be appended to the data portion 170 of the word 110, 112, 114, 116.

Binary matrix multiplication works as follows:
Assume two matrices, A and B:

$$A = a_1 \; a_2 \; \ldots \; a_n$$
$$B = \begin{matrix} b_{11} & b_{12} & b_{13} & \ldots & b_{1m} \\ b_{21} & b_{22} & b_{23} & \ldots & b_{2m} \\ & & \vdots & & \\ b_{n1} & b_{n2} & b_{n3} & \ldots & b_{nm} \end{matrix}$$ (Eqs. 1a and 1b)

A×B using binary matrix multiplication produces the m bit result, $$C = c_1 \; c_2 \; c_3 \ldots c_m$$ (Eq. 2)

Where $$c_i = \sum_{j=1}^{n} a_j \times b_{ji}$$ (Eq. 3a)

and where the "product" (indicated by 'x') of two numbers is the binary "AND" function, and the "sum" of a sequence of numbers is the exclusive-OR of the sequence: 0 if the number of '1's in the sequence is an even number, and 1 otherwise.

Each of the products in Equation 3 need not be computed where $a_j$ or $b_{ji}$ is known in advance to be zero, because the product of these terms will not affect the result $c_i$. Additionally, where the terms of one matrix are known in advance to be zero or one, the product itself need not be computed: the corresponding terms in the other matrix which would have been ANDed with the known terms equal to one may be exclusive-ORed with each other. Thus Equation 3a becomes, for known values of $b_{ji}$:

$$c_i = \sum_{j=1}^{n} a_j \text{ only for } j \text{ where } b_{ji} = 1$$ (Eq. 3b)

While conventional error detection and error detection codes can detect, or detect and correct, certain errors within each word 110, 112, 114, 116 of a packet 102, these conventional error detection codes and error detection and correction codes cannot detect the presence of intraword errors, such as a word in the packet 102 out of its original sequence or a word from one packet improperly inserted in place of a word in another packet.

The first of the two problems arises when words 110, 112, 114, 116 are assembled, transmitted or received in the improper order. Because the data portion 170 within each word 110, 112, 114, 116 may match the corresponding error detection or error detection and correction codes 120, 122, 124, 126 the error detection or error detection and correction code 120, 122, 124, 126 cannot be used to identify the out-of-sequence error. The second problem arises when a word which is located in another packet is inserted among the words 110, 112, 114, 116 of the first packet. This problem may arise if a word is not properly written into a memory, and an old value remains in place of the new value. Because the data portion 170 in this improperly-inserted word can match the corresponding error code, using an error correction and detection code will not identify the fact that the word has been improperly inserted into the wrong packet. Thus, other means of detecting these additional two errors are required.

One method which identifies missing or improperly inserted words is to use a checksum technique. A transmitting site adds a final checksum word 118 which may contain a parity, either odd or even, of each of the columns from words 110, 112, 114, 116 above the checksum 118. For example, parity in column 0 is determined by exclusive-ORing the bits in Column 0 of words 110, 112, 114, 116. Upon receipt of the packet, the bits in each column are tested to ensure the proper parity. Improperly inserted words or missing words may generate parity errors. Checksum 118 may also be a cyclical redundancy checksum, or CRC. However, the use of a checksum 118 requires that all of the words 110, 112, 114, 116, 118 are received before errors may be detected. Where words are received sequentially, undesirable delays are introduced before each word 110, 112, 114, 116 may be used at the receiving site. Additionally, the checksum method cannot identify a packet in which each of the words 110, 112, 114, 116 is in the packet, but out of their original order.

SUMMARY OF INVENTION

Using matrix multiplication of the data and coloring information, coloring is performed either on the error codes of the words in the packet, allowing for the rapid detection of out-of-order and improperly-inserted words in a packet, and leaving the data words unchanged for immediate use upon receipt. Alternately, coloring is performed on the data words in the packet after the error code is computed allowing for the rapid detection of out-of-order and improperly-inserted words in a packet, while simplifying the logic otherwise required to color the error codes.

DETAILED DESCRIPTION OF A PREFERRED EMBODIMENT

Figure 1A:
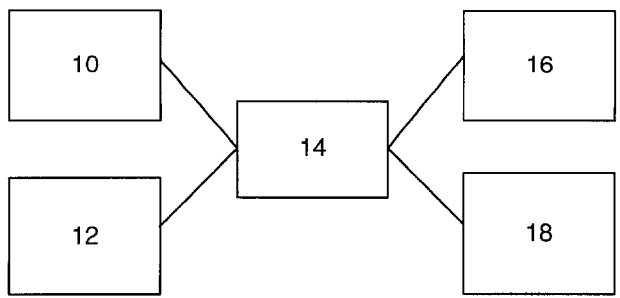
FIG. 1A is a block schematic diagram of four devices coupled to a router in a conventional packet switching network.

According to the present invention, "coloring" techniques are used to identify out-of-order words or improperly inserted words. Referring again to FIG. 1, "hashing" and "coloring" means exclusive-ORing a set of bits with some or all of the bits of the data 170 or error 172 portion of the header or data words 110, 112, 114, 116. Exclusive-ORing the same pattern a second time with the colored data or error code yields uncolored data or error codes. The present invention colors one or more known patterns into the error code portion 172 or data portion 170 of some or all of the words 110, 112, 114, 116. The coloring is removed upon receipt of the packet. Checksums 118 are not used in the packet 100. Because removal is performed according to the expected sequence and collection of each of the words 110, 112, 114, 116, out-of-sequence words or improperly inserted words result in errors inserted into the error code portion 172 or data portion 170. When the data portion 170 is verified using the error detection or error detection and correction code of the error portion 172 the data portion 170 will be identified as corrupted.

In one embodiment of the present invention, the error portion 172 of the data words 112, 114, 116 are colored, and in another embodiment, the data portion 170 of the data words 112, 114, 116 are colored. The first embodiment is known as "coloring on error codes," and the second embodiment is known as "coloring on data."

A. Coloring on Error Codes.

Figure 2A:
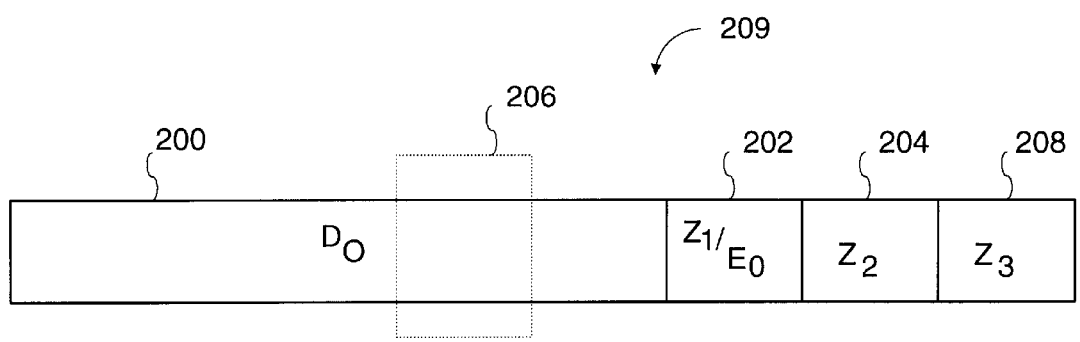
FIG. 2A is a block diagram illustrating the positions of data and coloring information in a first matrix for coloring a header word according to one embodiment of the present invention.
Figure 3:
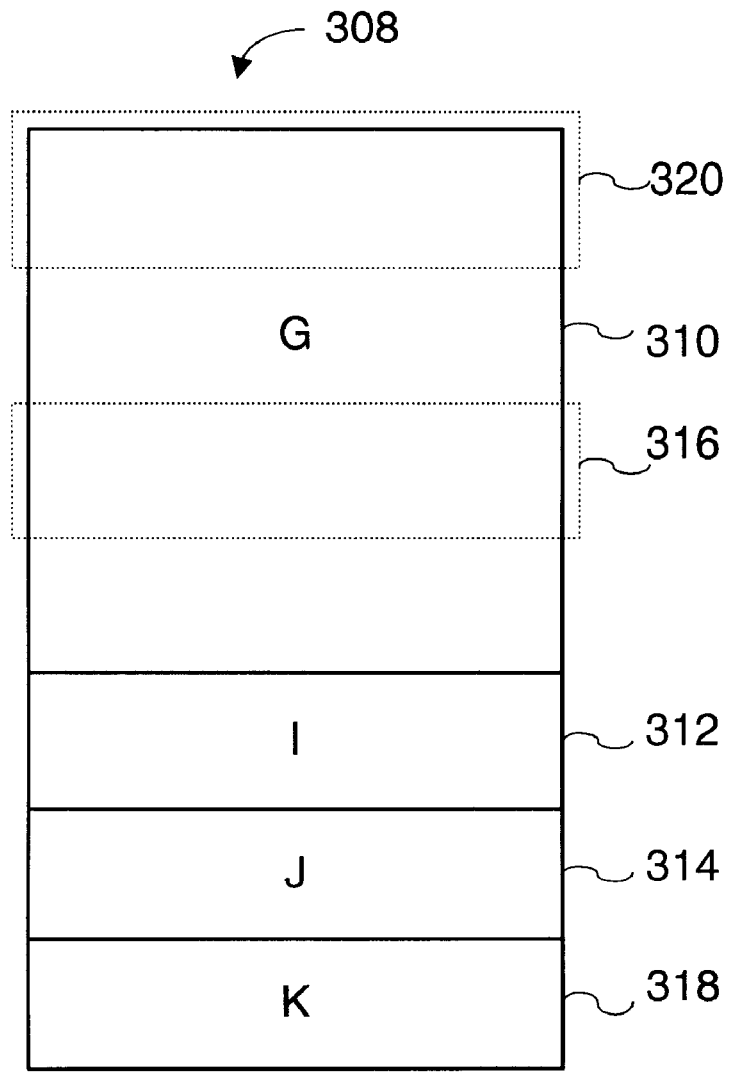
FIG. 3 is a a block diagram illustrating the positions of coloring information in a second matrix according to one embodiment of the present invention.

An error detection or error detection and correction code may be generated and hashed with sequence and packet identifiers using binary matrix multiplication of two matrices. Referring now to FIG. 2A and 3, for each packet having header word $D_0$ and y words of data $D_1$ through $D_y$, the m-bit error code $E_0$ to append to the header packet on transmission is:

$$E_0 = DD_0 \times H' \qquad \text{(Eq. 4)}$$

Where
$DD_0$ 209 is the concatenation of $D_0$ 200, $Z_1$ 202, $Z_2$ 204 and $Z_3$ 208 where
  $Z_1$ 202 is a sequence of m '0's;
  $Z_2$ 204 is a sequence of q (defined below) '0's; and
  $Z_3$ 208 is a sequence of y '0's;
and where, in one embodiment,
  H' 308 is the concatenation of G 310 above I 312 above J 314 above K 318, where
  G 310 is an error detection or detection/correction matrix, such as the matrix of Appendix A;
  I 312 is a y-bit square unit matrix of all '0's except $I_{kk}$='1' for all k, from 1 to y;
  J 314 is a subset 316 of G, having all columns of the rows corresponding to the bit positions of $U_0$, described below; and
  K 318 is a subset 320 of G having all columns of any y rows not in J.

Some error detection or detection/correction matrices, such as the matrix of Appendix A, each row is orthogonal to the other rows in that matrix. In one embodiment, J and K may have any value such that each row of the matrix made of G above J above K is orthogonal to every other row in the matrix made of G above J above K.

Figure 2B:
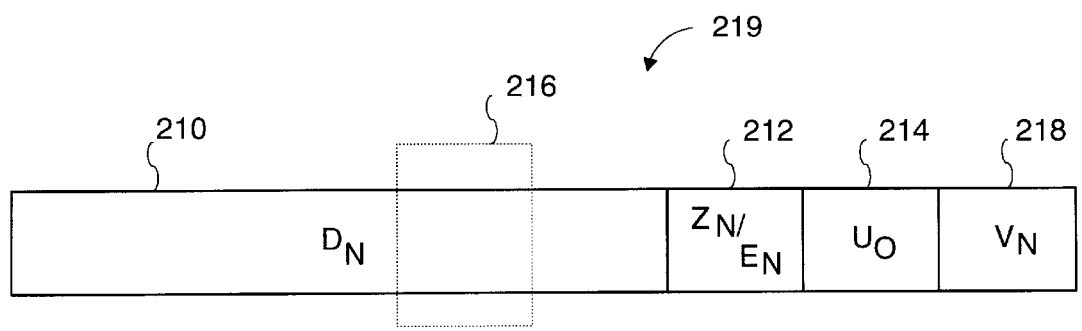
FIG. 2B is a block diagram illustrating the positions of data and coloring information in a first matrix for coloring data words according to one embodiment of the present invention.

Referring now to FIGS. 2A and 2B, the error code $E_N$ to append to each data word $D_N$ where $$N = 1 \text{ to } y \qquad \text{(Eq. 5)}$$

is:

$$E_N = DD_N \times H' \qquad \text{(Eq. 6)}$$

where $DD_N$ 219 is the concatination of $D_N$ 210, $Z_N$ 212, $U_0$ 214 and $V_N$ 218, where
  $U_0$ is a q-bit identifier portion 206 of $D_0$ which is expected to be "nearly unique," that is, has a low probability of being duplicated in another header; and
  $V_N$ is a sequence of y '0's, with a '1' substituted in place of the N to the last '0'. e.g. $V_1$=00000001, $V_2$=00000010, etc.

At the receiving site, the coloring information is decolored, from the corresponding error code to produce y+1 check codes $C_0$ through $C_y$, which should each be all zeros if there are no errors within the word, the word is in the proper sequence, and the word is in the proper packet. The error code $C_0$ for the header is $$C_0 = CC_0 \times H' \qquad \text{(Eq. 7)}$$

where $CC_0$ 209 is the concatination of $D_0$ 200, $E_0$ 212, $Z_2$ 204 and $Z_3$ 208.

The error codes $C_N$ for the remaining data words are $$C_N = CC_N \times H' \qquad \text{(Eq. 8)}$$

Where $CC_N$ 219 is the concatination of $D_N$ 210, $E_N$ 212, $U_0$ 214 and $V_N$ 218.

Figure 1B:
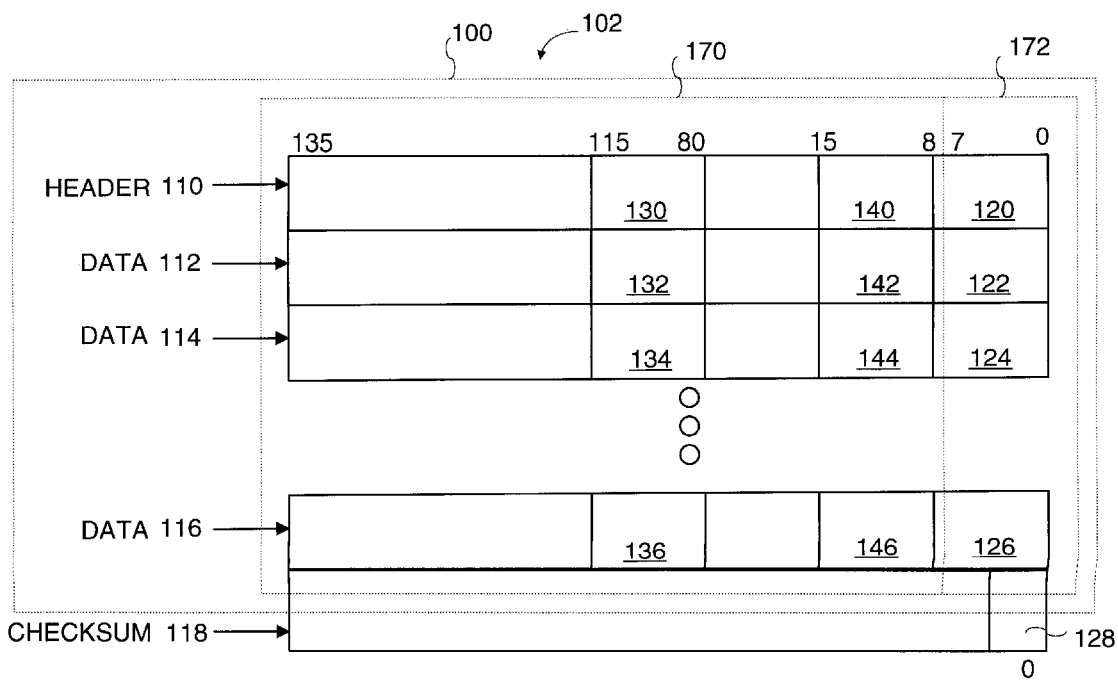
FIG. 1B is a block diagram illustrating header, data and checksum words in a conventional packet.

Referring momentarily to FIG. 1, in one embodiment, the header 110 is word 0, and up to eight data words 112, 114, 116 follow the header, words 1–8, the nearly unique portion 130 of the packet 100 is bits 80–115 of the header 110 and the y columns not in J which will be binary matrix multiplied with K are columns 8–15 140, 142, 144, 146. An eight bit error code is computed as described above using the table in Appendix A as the G matrix, and this error code is appended to each word prior to transmission of the packet. Upon receipt, the check codes described above are calculated and checked to see if the check codes are all zeros, indicating no bit or out of sequence or or misinserted word errors have occurred.

Figure 4A:
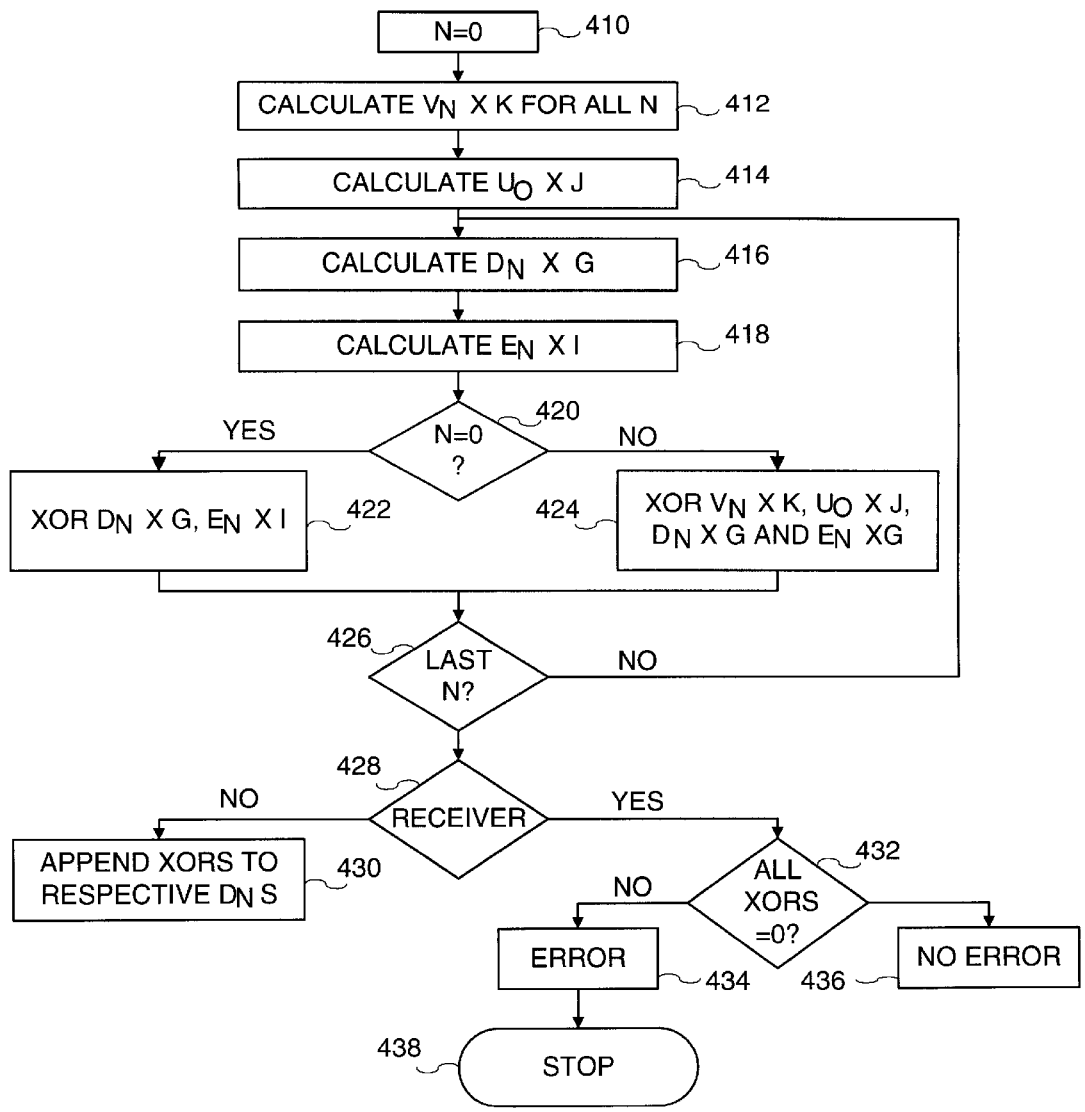
FIG. 4A is a flowchart illustrating a method of coloring and uncoloring error codes for header and data words of a packet according to one embodiment of the present invention.

Referring now to FIG. 4A, one embodiment of a method of detecting bit or out of sequence or misinserted word errors according to the present invention is shown. The method of FIG. 4A may be performed at the transmitting site to produce an error code for each word of the packet, and again at the receiving site to check the packet. As described below, it is not necessary to multiply each pair of matrices in Equations 4, 5, 7 and 8 all at once, as each matrix may be split into sub matrices, pairs of submatrices may be multiplied using binary matrix multiplication, and the products of each of the pairs of submatrices exclusive-ORed to achieve the same result as a single binary matrix multiplication of the original pair of matrices. The product of any pair of submatrices is known as a "coloring product".

A counter N is set to zero 410, and will keep track of which word, from 0 to 9 in one embodiment, in the packet is being processed. Coloring product $V_N \times K$ may be calculated for all N 412 because the result is independent of any of the words in the packet. In one embodiment, $V_N \times K$ is calculated only for the current value of N. In such embodiment, step 412 for only one K would be moved below step 414 to fall within the loop which begins below step 414. In one embodiment, the "calculation" of $V_N \times K$ is a table lookup because $V_N$ and K are both constants, with a product which may be precomputed and stored in a table. In another embodiment, $V_N \times K$ is actually calculated using the technique of binary matrix multiplication. The result of the calculation may be stored for future use.

A portion of the header word $D_0$ and the J submatrix are used to calculate the coloring product $U_0 \times J$, 414 which may be stored for future use. In another embodiment, $U_0 \times J$ is calculated when it is used as described below, although in such embodiment, $U_0$ must be stored. The current word $D_N$, where the header word is $D_0$ and each data words are $D_1$ through $D_8$ is used to calculate $D_N \times G$ 416.

Step 418 is performed by the receiving site to compute the coloring product $E_N \times I$. At the transmitting site step 418 may be performed with $E_N$ equal to all zeros in one embodiment, or step 418 may be omitted in another embodiment.

As described above in Equations 4 and 6, and 7 and 8, the calculations for the header word are different from the calculations for the remaining data words. Thus, if N=0 420, the current word is the header word and the results of steps 416 and 418 are exclusive-ORed together to produce a result 422. Otherwise, the current word is a data word, and the results of steps 412 for the current value of N, and the results of steps 414, 416 and 418 are exclusive-ORed to produce a result 424.

In one embodiment, the steps 416, 418, 420, 422, 424 described above are repeated until all of the words in the packet have been processed 426. At the transmitting site, the results of steps 422 and 424 are appended to the respective words $D_0$ through $D_8$ 430. At the receiving site, the results of steps 422 and 424 are checked to ensure each bit is zero 432, indicating no error has occurred 436. If any of the results of steps 422, 424 are nonzero, an error has occurred 432, 434, indicating one or more incorrect bits in the word, an out-of-order word in the packet, or an improperly inserted word is in the packet, and the method may terminate 438.

Figure 4B:
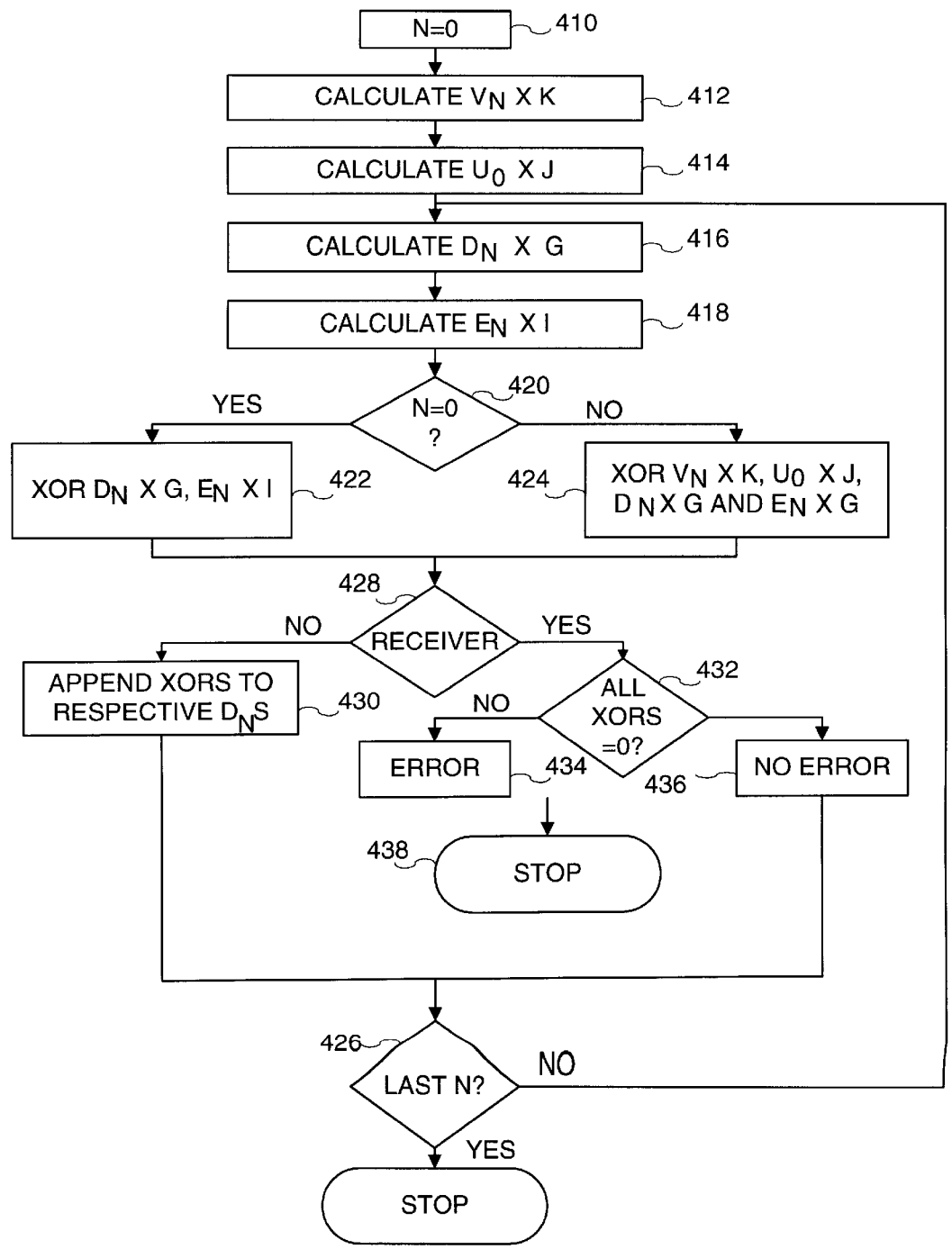
FIG. 4B is a flowchart illustrating a method of coloring and uncoloring error codes for header and data words of a packet according to an alternate embodiment of the present invention.

In another embodiment, each result produced by steps 422, 424 are appended or checked one at a time. Referring now to FIG. 4B, an alternative method according to one embodiment of the present invention is shown. Steps 410, 412, 414, 416, 420, 422, 424 operate as described above, but step 426 has been shifted down to allow steps 428, 430, 432, 434, and 436 to be performed after the calculation of each result from steps 422 and 424. This allows the error codes to be immediately appended to each data word, or immediately checked, as they are computed, which can allow the process to be suspended 438 if any error is discovered. In this embodiment, an error can allow the receiver to generate a request to the sender to resend the packet or to suspend processing of the packet sooner than the embodiment described in FIG. 4A, which only detects errors after all of the words in the packet have been received and checked.

Referring now to FIGS. 4A and 4B, in one embodiment, step 428 is not performed: instead, step 430 is performed only at the transmitting site, omitting steps 432, 434, 436 and 438, or alternatively steps 432, 434, 436 and 438 are performed only at the receiving site, omitting step 430.

Figure 5:
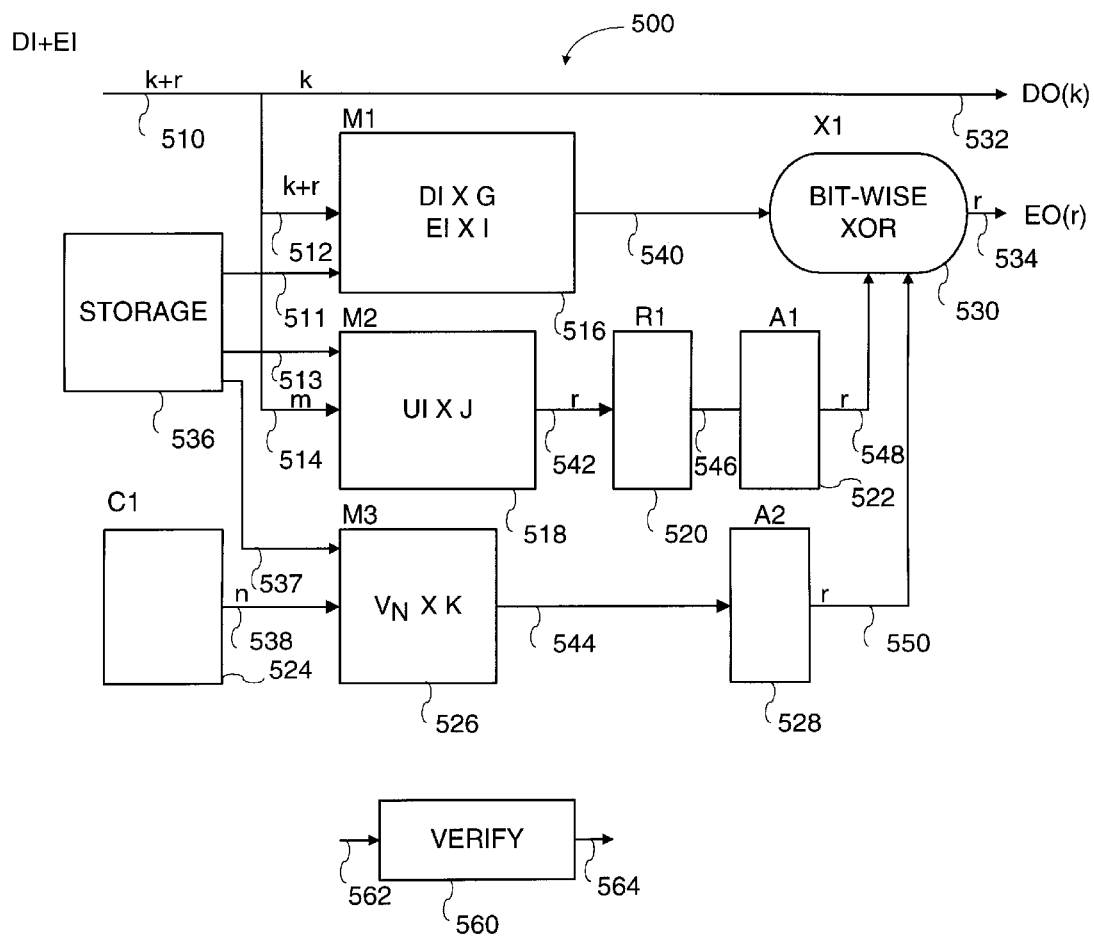
FIG. 5 is a block schematic diagram of an apparatus for coloring and uncoloring error codes for header and data words of a packet according to one embodiment of the present invention.

Referring now to FIG. 5, an apparatus 500 for computing error codes according to one embodiment of the present invention is shown. DI and EI inputs 510 accept a k-bit data portion of header or data word and a corresponding error code having r bits. In one embodiment, the apparatus 500 is used at both the sending and receiving sites, with the EI input of input 500 set to all zeros at the sending site. In another embodiment, inputs 510 accept only the data portion of the header or data words at the sending site.

Module M1 516 has an input 512 coupled to the DI and EI inputs 510 and an input 511 which is coupled to a storage device 536 such as a ROM or flash memory which stores the G and I matrices described above. Module M1 516 uses binary multiplication or an equivalent process to produce the product of DI at input 510 and the G matrix at input 511, and the product of EI at input 510 and the I matrix at input 511. In one embodiment, inputs 511 and 512 allow DI and EI to be presented to M1 516 simultaneously, and G and I to be presented to module M1 516 simultaneously. In another embodiment, the G and I matrices are stored in a storage device contained in module M1 516. In another embodiment, the G and I matrices are not stored, and DI and EI inputs 510 corresponding to elements of G and I having a value of 1 are exclusive-ORed using the logic of Equation 3b. In one embodiment, module M1 516 outputs both products simultaneously over line 540, in another embodiment the products are output sequentially and assembled by Exclusive-OR 530. In another embodiment, the products are exclusive-ORed prior to output over line 540.

Module M2 518 is coupled to the m bits of DI corresponding to $U_0$ via input 514 and computes the binary matrix multiplication of the bits corresponding to $U_0$ of the input DI at input 510 and the J matrix described above at input 513. This allows for the computation of $U_0$ at the time the DI input of input 510 is coupled to $D_0$. Register R1 520 latches the product produced by module M2 518 when header $D_0$ is at the DI input of input 510 for use with the data words of the packet. It isn't necessary that the header word always arrive as the first word of the packet, as long as register R1 520 is able to distinguish the header from the remaining data words in the packet. However, in such case, the data words which arrive prior to the header must be stored until the header arrives if the header contains identifier information required to decolor the data words. In another embodiment, module M2 518 is not coupled to storage module 536, instead storing the J matrix within module M2 518. In another embodiment, the J matrix is not stored, and $U_0$ corresponding to elements of J having a value of 1 are exclusive-ORed using the logic of Equation 3b. However, because the J matrix is a subset of the G matrix, the use of the storage device 536 by modules M1 516 and M2 518 may require duplicate storage of the J matrix for use in the G matrix by module M1 516 and for use alone by module M2 518.

Module M3 may be coupled to receive the K matrix described above from storage module 536 via input 537, or alternately, may store the K matrix within module M3 526. The K matrix is a subset of the G matrix, so the alternate embodiment may require additional storage, as K may be stored for use in the G matrix by M1 516 and for use alone by module M3 526. In another embodiment, the result of $V_N \times K$ is precomputed and stored in a storage device such as storage device 536 or in a similar device within module M3 526 to speed computation because the result provided at output 544 requires none of the inputs 510.

In one embodiment, masks A1 522 and A2 528 mask the input of the preceding stages 520 and 526 respectively, to block the output of the preceding stages when those outputs correspond to the header word. As described above in Equations 4 and 7, computations for the header word do not utilize $V_N \times K$ or $UI \times J$, and thus A1 522 and A2 528 have outputs 548, 550 equal to all zero when the outputs 546, 544 correspond to the header word. Exclusive OR 530 exclusive-ORs the outputs 540, 548, 550 to produce the r-bit EO output 534.

At the sending site, EO output 534 is the error code $E_N$ to append to the data word DI at input 510, which is transferred to DO output 532 unchanged. At the receiving site, EO output 534 is $C_N$, which is all zero if none of the errors described above are detected. EO output 534 may be coupled to the input 562 of verifier 560, which signals true at its output 564 if all bits of E0 output 534 are zero.

B. Coloring on Data.

Where it is desirable to simplify the logic otherwise required for coloring on error codes, and it is not necessary to have the data arrive uncolored at the receiving site, the data may be colored.

Figure 6:
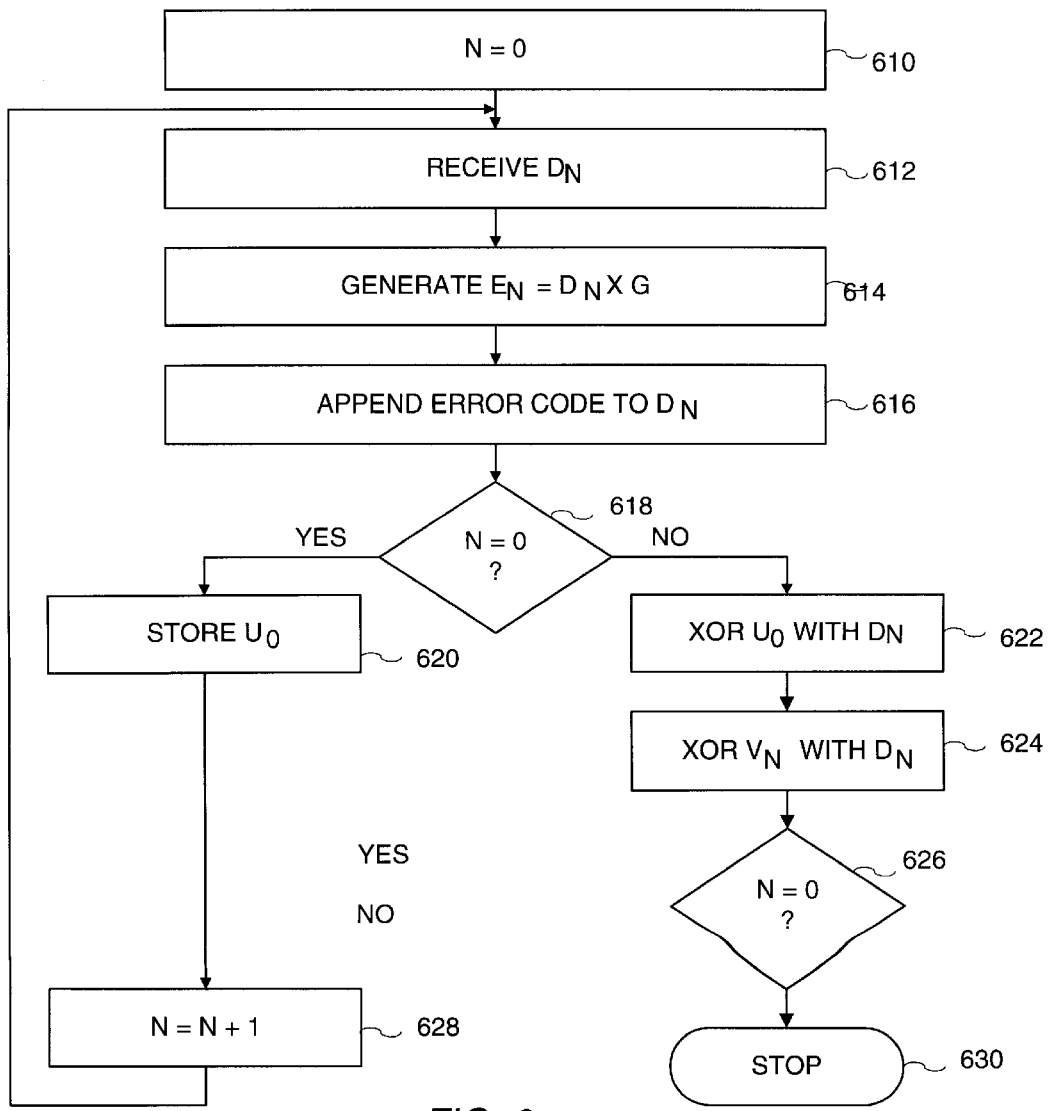
FIG. 6 is a flowchart illustrating a method of coloring data in data words of a packet according to an alternate embodiment of the present invention.

Referring now to FIG. 6, one method of coloring data according to one embodiment of the present invention is shown. A counter N is used to keep track of the order of each word, with zero corresponding to the header word. N is set to zero, 610 and a word is received 612. The error code is generated 614 any error code generation technique, such as the binary matrix multiplication of $D_N \times G$. The error code so generated may be appended 616 to the data word for transmission in one embodiment, or separately sent and not appended in another embodiment. If N is zero 618, the word received in step 612 is the header, and the columns of $D_0$ corresponding to $U_0$ as described above are stored for later use 620. If N is not zero 618, the word received in step 612 is not a header word, and $U_0$ from the header corresponding to the packet containing $D_N$ is colored 622 into $D_N$ by exclusive-ORing the bits from $U_0$ with the bits in $D_N$ which are in the same columns as $U_0$. In one embodiment, sequence information $V_N$ is colored 624 into $D_N$ by exclusive-ORing $V_N$ with any of the bits in $D_N$ not exclusive-ORed with $U_0$. Steps 612, 614, 616, 618, 622, 624, 626 are repeated after adding 1 to N 628 for all the words in the packet, after which the method terminates 630.

Figure 7:
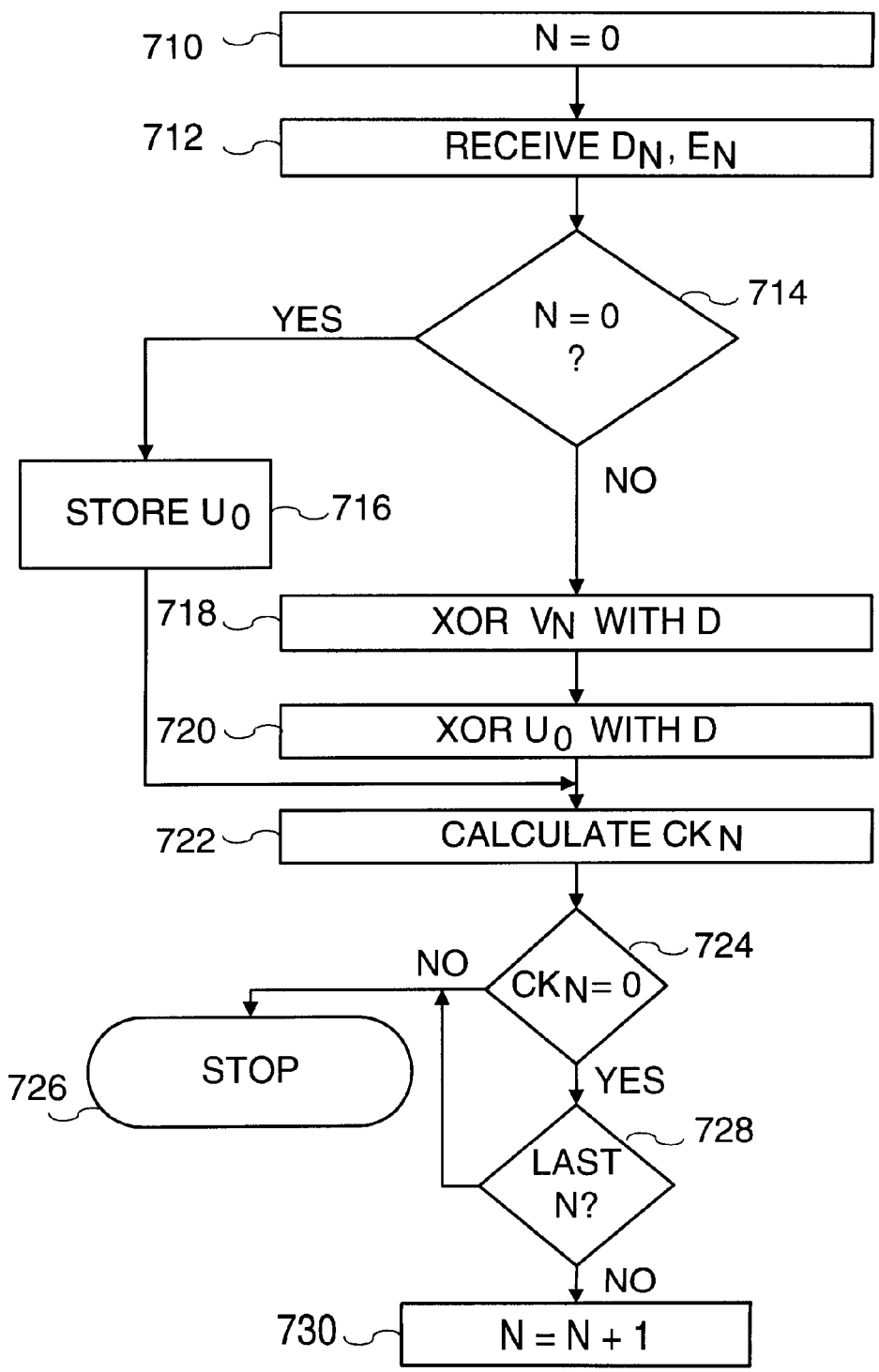
FIG. 7 is a flowchart illustrating a method of uncoloring data in data words of a packet according to an alternate embodiment of the present invention.

Referring now to FIG. 7, a method of uncoloring the data in the data words in a packet according to one embodiment of the present invention is shown. A counter N is set to zero 710 to signify the header word, and the data word and error code are received, with the data word colored as described with reference to FIG. 6. If N is zero, the word received in step 712 is a header word, and $U_0$ from the header word is stored 716 to be used to uncolor data words. Otherwise, the word received in step 712 is a data word, which is uncolored by exclusive-ORing the data word $D_N$ with $V_N$ 718 and $U_0$ 720 in the same bit positions as $V_N$ and $U_0$ were colored into $D_N$ as described with reference to FIG. 6. The check code $CK_N$ is calculated 722 using binary matrix multiplication of $E_N \times I$, exclusive-ORed with the uncolored data word $D_N \times G$. The check code is checked to see that it is all zeros 724, and if the check code is not zero, a bit error, sequence error, or misinserted word error has occurred and the process may terminate 726. Otherwise, N is incremented 728 and the above steps excluding step 710 are repeated until all words in the packet have been processed 728.

Figure 8:
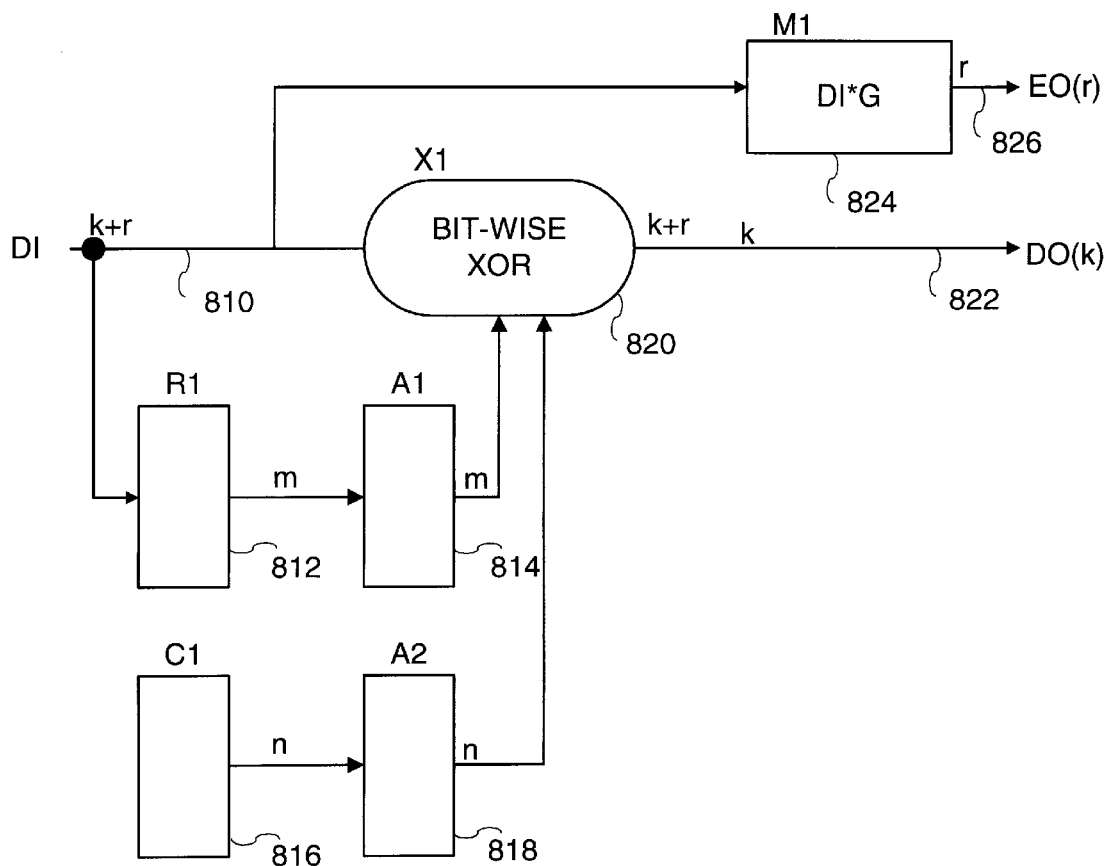
FIG. 8 is a block schematic diagram of an apparatus for coloring data in data words of a packet according to an alternate embodiment of the present invention.

Referring now to FIG. 8, an apparatus for coloring words in a packet according to one embodiment of the present invention is shown. Data input DI 810 accepts the data or header word, and module M1 824 computes the error code of the uncolored data word using binary matrix multiplication of the data word received at the input 810 and the G matrix. In one embodiment, the G matrix is stored in a ROM in module M1 824, and in another embodiment the principles of Equation 3b are used to exclusive-OR bits in DI corresponding to bits equal to one in G. R1 812 latches $U_0$ when DI 810 receives the header $D_0$. A1 814 passes the output of R1 812 to its output except when DI 810 receives the header $D_0$ so as not to color the header. C1 provides $V_N$ for each $D_N$ by counting the words received at DI 810 beginning with zero. A2 818 passes the output of C1 816 to its output except when DI receives D0, in which case A2 818 has output equal to all zeros, so as not to color the header. X1 820 exclusive-ORs the coloring information from A1 814 and A2 818 to provide a colored data output 822 to be transmitted.

Figure 9:
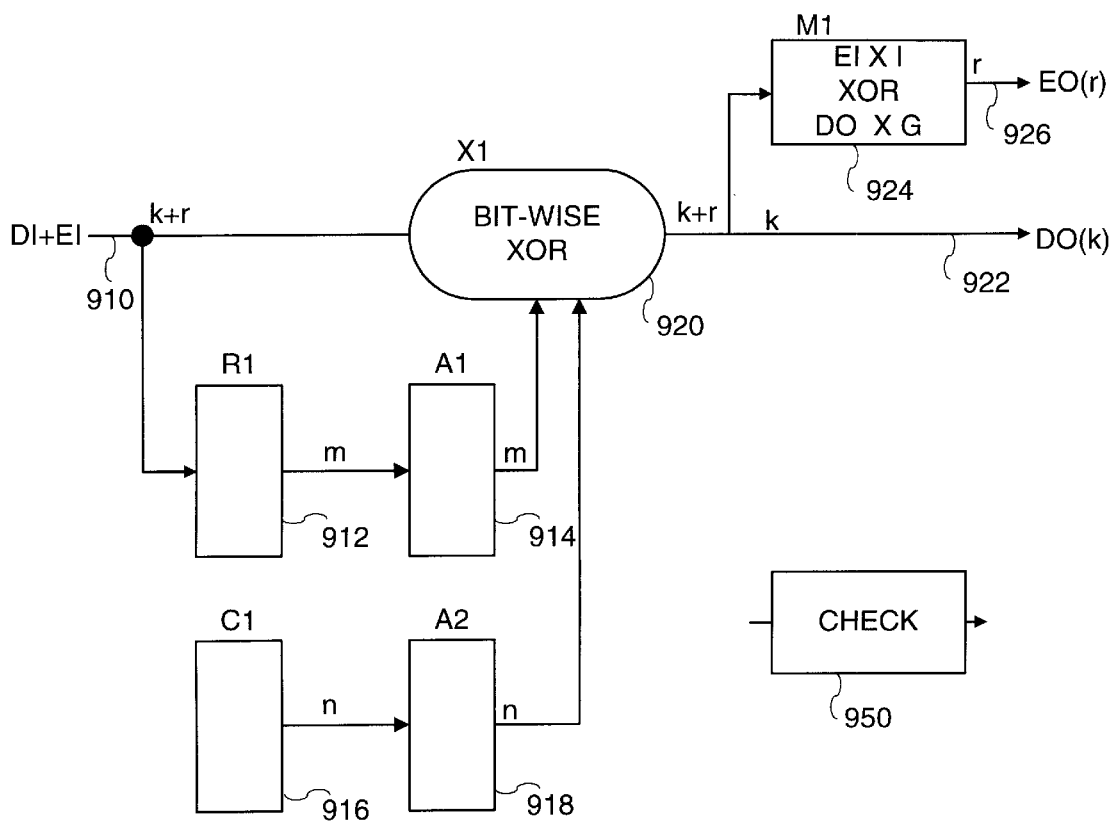
FIG. 9 is a block schematic diagram of an apparatus for uncoloring data in data words of a packet according to an alternate embodiment of the present invention.

Referring now to FIG. 9, an apparatus for uncoloring data words is shown. Colored data and error codes are received by DI+EI input 910. R1 912 latches U0 when input 910 contains the header data and error code to use to uncolor the data words. C1 916 provides $V_N$ in the same manner as C1 816 of FIG. 8. A1 914 and A2 918 operate the same as A1 814 and A2 816 of FIG. 8. Exclusive-OR X1 920 exclusive-ORs the bits from A1 and A2 with the same bits of DI at input 910 as were colored as described with reference to FIG. 8 to produce the uncolored data output DO 922. DO 922 is binary matrix multiplied by G, and EI from input 910 is binary matrix multiplied by the I matrix, and each result is exclusive-ORed with the other to produce the check code $CK_N$ at EO output 926. $CK_N$ will be zero if no bit errors, out of sequence errors or misinserted word errors have occurred. The EO output may be coupled to the input of Check 950, which outputs true if all bits at its input are zero.

APPENDIX A

The G Matrix

| | G Col [0] | G Col [1] | G Col [2] | G Col [3] | G Col [4] | G Col [5] | G Col [6] | G Col [7] |
|---|---|---|---|---|---|---|---|---|
| G Row[0] | X | | X | X | | | | X |
| G Row[1] | | | X | X | | | X | X |
| G Row[2] | X | | X | X | | X | | |
| G Row[3] | X | X | X | | | | | X |
| G Row[4] | | | | X | X | X | X | |
| G Row[5] | X | X | | | | X | | X |
| G Row[6] | | X | | X | X | X | | |
| G Row[7] | X | X | | | X | | | X |
| G Row[8] | X | | | X | X | X | | |
| G Row[9] | X | X | | X | | | | X |
| G Row[10] | | | | X | X | X | | X |
| G Row[11] | | X | | | | X | | X |
| G Row[12] | | X | X | | | | X | |
| G Row[13] | | X | X | | | | | X |
| G Row[14] | | | | X | | X | | X |
| G Row[15] | X | | | | | X | | X |
| G Row[16] | | X | | X | X | | | |
| G Row[17] | X | | | X | | | | X |
| G Row[18] | X | | X | X | | | | |
| G Row[19] | X | | | X | | | | X |
| G Row[20] | | | | X | X | | | X |
| G Row[21] | X | | X | | | | | X |
| G Row[22] | | | X | X | | X | | |
| G Row[23] | X | X | | | | | | X |
| G Row[24] | | | | X | X | X | | |
| G Row[25] | | X | | | | | X | |
| G Row[26] | | | X | | | X | | |
| G Row[27] | | | X | | X | | | |
| G Row[28] | | | X | | | | | X |
| G Row[29] | | | | | X | X | | |
| G Row[30] | | X | | | | | X | |
| G Row[31] | | X | | | | X | | |
| G Row[32] | | X | | X | | | | |
| G Row[33] | | | X | X | | | | |
| G Row[34] | X | X | | | | | X | X |

APPENDIX A-continued

The G Matrix

|  | G Col [0] | G Col [1] | G Col [2] | G Col [3] | G Col [4] | G Col [5] | G Col [6] | G Col [7] |
|---|---|---|---|---|---|---|---|---|
| G Row[35] |  |  | X | X |  | X | X |  |
| G Row[36] |  | X | X |  | X |  |  | X |
| G Row[37] | X | X |  |  |  |  | X | X |
| G Row[38] |  |  | X | X | X | X |  |  |
| G Row[39] | X |  |  |  | X |  | X | X |
| G Row[40] | X |  | X | X | X |  |  |  |
| G Row[41] | X |  |  | X |  |  | X | X |
| G Row[42] |  |  | X | X | X |  |  | X |
| G Row[43] | X |  | X |  |  |  | X | X |
| G Row[44] |  |  | X | X | X |  | X |  |
| G Row[45] |  | X |  |  | X |  | X |  |
| G Row[46] | X |  | X |  |  | X |  |  |
| G Row[47] | X |  | X |  |  |  | X |  |
| G Row[48] |  |  | X |  | X |  | X |  |
| G Row[49] |  |  |  |  | X |  | X | X |
| G Row[50] | X |  | X | X |  |  |  |  |
| G Row[51] |  |  |  | X |  |  | X | X |
| G Row[52] |  |  | X | X |  |  | X |  |
| G Row[53] |  |  | X |  |  | X | X |  |
| G Row[54] |  |  | X | X |  |  | X |  |
| G Row[55] |  | X |  |  |  |  | X | X |
| G Row[56] |  | X |  | X |  | X |  |  |
| G Row[57] | X |  |  |  |  |  | X | X |
| G Row[58] |  |  | X | X | X |  |  |  |
| G Row[59] | X |  |  |  | X |  |  |  |
| G Row[60] |  | X |  |  |  |  | X |  |
| G Row[61] |  |  |  | X |  | X |  |  |
| G Row[62] | X |  |  |  |  |  | X |  |
| G Row[63] |  |  |  |  |  | X | X |  |
| G Row[64] |  | X |  |  |  | X |  |  |
| G Row[65] |  | X |  |  | X |  |  |  |
| G Row[66] |  | X |  | X |  |  |  |  |
| G Row[67] |  | X | X |  |  |  |  |  |
| G Row[68] | X | X |  |  |  | X | X |  |
| G Row[69] |  | X | X |  | X | X |  |  |
| G Row[70] | X | X |  | X |  |  | X |  |
| G Row[71] | X |  |  |  |  | X | X | X |
| G Row[72] |  | X | X | X |  |  |  |  |
| G Row[73] |  |  |  | X |  | X | X | X |
| G Row[74] |  | X | X | X |  |  |  | X |
| G Row[75] |  | X |  |  | X | X | X |  |
| G Row[76] |  | X | X | X |  |  | X |  |
| G Row[77] |  | X |  |  |  | X | X | X |
| G Row[78] |  | X | X | X | X |  |  |  |
| G Row[79] | X |  |  | X | X |  |  |  |
| G Row[80] |  | X |  |  | X |  |  | X |
| G Row[81] |  | X |  |  | X |  |  | X |
| G Row[82] |  | X |  | X | X |  |  |  |
| G Row[83] |  |  |  | X |  | X | X |  |
| G Row[84] |  | X | X |  |  |  |  | X |
| G Row[85] |  |  | X |  |  | X | X |  |
| G Row[86] |  | X | X |  |  |  | X |  |
| G Row[87] |  | X |  |  |  | X | X |  |
| G Row[88] |  | X | X |  |  | X |  |  |
| G Row[89] | X |  |  |  |  | X | X |  |
| G Row[90] | X | X |  | X |  |  |  |  |
| G Row[91] |  |  |  |  | X | X | X |  |
| G Row[92] |  | X | X | X |  |  |  |  |
| G Row[93] |  |  |  |  | X |  |  | X |
| G Row[94] | X |  |  |  |  | X |  |  |
| G Row[95] |  |  |  |  |  | X |  | X |
| G Row[96] |  |  |  | X | X |  |  |  |
| G Row[97] |  |  |  |  |  |  | X | X |
| G Row[98] | X |  |  |  | X |  |  |  |
| G Row[99] | X |  |  | X |  |  |  |  |
| G Row[100] | X |  | X |  |  |  |  |  |
| G Row[101] | X | X |  |  |  |  |  |  |
| G Row[102] | X |  |  |  | X | X |  | X |
| G Row[103] | X | X |  | X | X |  |  |  |
| G Row[104] | X |  | X |  |  |  | X | X |
| G Row[105] |  |  |  |  | X | X | X | X |
| G Row[106] | X | X | X | X |  |  |  |  |
| G Row[107] |  |  | X |  | X |  | X | X |
| G Row[108] | X | X | X |  |  |  | X |  |
| G Row[109] |  | X |  |  | X | X | X |  |
| G Row[110] | X | X | X |  |  | X |  |  |
| G Row[111] | X |  |  |  | X | X | X |  |
| G Row[112] | X | X | X |  | X |  |  |  |
| G Row[113] |  |  | X |  | X |  |  | X |
| G Row[114] | X |  |  | X |  |  | X |  |
| G Row[115] | X |  |  |  | X |  | X |  |
| G Row[116] | X |  | X |  | X |  |  |  |
| G Row[117] |  | X |  |  | X | X |  |  |
| G Row[118] | X | X |  |  |  |  | X |  |
| G Row[119] |  | X |  |  | X | X |  |  |
| G Row[120] | X | X |  |  |  | X |  |  |
| G Row[121] | X |  |  |  | X | X |  |  |
| G Row[122] | X | X |  |  | X |  |  |  |
| G Row[123] |  |  |  |  | X | X |  | X |
| G Row[124] |  |  |  | X | X |  | X |  |
| G Row[125] |  |  |  |  | X | X | X |  |
| G Row[126] | X | X | X |  |  |  |  |  |
| G Row[127] |  | X |  |  |  |  |  | X |

X = 1, blank = 0

What is claimed is:

1. A method of detecting errors for a word in a packet, the word having a data portion and a sequence position in the packet, the method comprising:

producing from the data portion of the word, a code to detect bit errors within :he word;

producing from an identifier field a coloring product; and exclusive-ORing the produced code to detect bit errors and the produced coloring product to generate a code to detect word errors, wherein the identifier field comprises a packet identifier or a set of digits identifying the sequence position of the word.

2. The method of claim 1, further comprising the step of transmitting the word and the code to detect word errors.

3. The method of claim 2, wherein the step of producing a code to detect bit errors further comprises the step of multiplying the data portion with a matrix.

4. The method of claim 2, wherein the step of producing a coloring product further comprises the step of multiplying the packet identifier with a matrix.

5. The method of claim 2, wherein the step of producing a coloring product further comprises the step of multiplying the set of digits identifying the sequence position of the word with a matrix.

6. The method of claim 1, further comprising the step of receiving the word and the code to detect word errors.

7. The method of claim 6, wherein the step of producing a code to detect bit errors further comprises the step of multiplying the data portion with a matrix.

8. The method of claim 6, wherein the step of producing a coloring product further comprises the step of multiplying the code to detect word errors with a matrix.

9. The method of claim 6, wherein the step of producing a coloring product further comprises the step of multiplying a packet identifier with a matrix.

10. The method of claim 6, wherein the step of producing a coloring product further comprises the step of multiplying the set of digits identifying the sequence position of the word with a matrix.

11. An apparatus to detect errors for a word in a packet, the word having a data portion and a sequence position in the packet, the apparatus comprising:

a data input for accepting the data portion of the word;

a first module having a first input coupled to the data input and an output, the first module for producing at the output a code to detect bit errors within the word;

a second module having a first input for receiving an identifier field and an output, the second module for producing a coloring product;

an Exclusive-OR having a first input coupled to the first module output, a second input coupled to the second module output, and an output, the Exclusive-OR for computing and presenting at its output a code to detect word errors;

an error output coupled to the Exclusive-OR output; and a data output coupled to the data input, wherein the identifier field comprises a packet identifier or a set of digits identifying the sequence position of the word.

12. The apparatus of claim 11, wherein the word and the code to detect word errors are positioned to be transmitted.

13. The apparatus of claim 12, further comprising a storage device having a first output coupled to a second input of the first module, the storage device for storing a matrix to be multiplied with the data portion of the word.

14. The apparatus of claim 12, further comprising a storage device having a first output coupled to a second input of the second module, the storage device for storing a matrix to be multiplied with the packet identifier.

15. The apparatus of claim 12, further comprising a storage device having a first output coupled to a second input of the second module, the storage device for storing a matrix to be multiplied with the set of digits identifying the sequence position of the word.

16. The apparatus of claim 11, further comprising an error input coupled to a second input of the first module, the error input for accepting the code to detect word errors, wherein the word and the code to detect word errors are positioned to be received.

17. The apparatus of claim 16, further comprising a storage device having a first output coupled to a second input of the first module, the storage device for storing a matrix to be multiplied with the data portion of the word.

18. The apparatus of claim 16, further comprising a storage device having a first output coupled to a second input of the second module, the storage device for storing a matrix to be multiplied with the code to detect word errors.

19. The apparatus of claim 16, further comprising a storage device having a first output coupled to a second input of the second module, the storage device for storing a matrix to be multiplied with the packet identifier.

20. The apparatus of claim 16, further comprising a storage device having a first output coupled to a second input of the second module, the storage device for storing a matrix to be multiplied with the set of digits identifying the sequence position of the word.

21. A method of detecting errors for a word in a packet, the word having a data portion and a sequence position in the packet, the method comprising:

producing from the data portion of the word, a code to detect bit errors within the word; and exclusive-ORing the data portion and an identifier field to generate a code to detect word errors, wherein the identifier field comprises a packet identifier or a set of digits identifying the sequence position of the word.

22. The method of claim 21, further comprising the step of transmitting the word and the code to detect word errors.

23. The method of claim 22, wherein the step of producing a code to detect bit errors further comprises the step of multiplying the data portion with a matrix.

24. The method of claim 22, wherein the identifier field comprises the packet identifier.

25. The method of claim 22, wherein the identifier field comprises the set of digits identifying the sequence position of the word.

26. The method of claim 21, further comprising:

receiving the word and the code to detect word errors; and producing a check code.

27. The method of claim 26, wherein the step of producing a check code further comprises the step of multiplying the data portion with the set of digits identifying the sequence position of the word.

28. The method of claim 26, wherein the step of producing a check code further comprises the step of multiplying the data portion with the packet identifier.

29. The method of claim 26, wherein the step of producing a check code further comprises the steps of:

multiplying the data portion with a matrix;

multiplying the code to detect word errors with a matrix;

exclusive-ORing the product of the multiplied data portion and the product of the multiplied code to detect word errors.

30. An apparatus to detect errors for a word in a packet, the word having a data portion and a sequence position in the packet, the apparatus comprising:

a data input for accepting the data portion of the word;

a first module having a first input coupled to the data input and an output, the first module for producing at the output a code to detect bit errors within the word;

a First Exclusive-OR having a first input coupled to the data input, a second input for receiving an identifier field, and an output, the First Exclusive-OR for coloring the data portion with the identifier field, thereby presenting at the output a code to detect word errors; and an error output coupled to the first module output, wherein the identifier field comprises a packet identifier or a set of digits identifying the sequence position of the word.

31. The apparatus of claim 30, further comprising a storage device having a first output coupled to a second input of the first module, the storage device for storing a matrix to be multiplied with the data portion of the word.

32. The apparatus of claim 30, further comprising a storage device having a first output coupled to a second input of the First Exclusive-Or, the storage device for storing the packet identifier.

33. The apparatus of claim 30, further comprising a storage device having a first output coupled to the second input of the First Exclusive-Or, the storage device for storing the set of digits identifying the sequence position of the word.

34. The apparatus of claim 30, further comprising a check code detector for receiving the word and the code to detect word errors, the check code detector further comprising:

a data input for accepting the code to detect word errors;

an error input for accepting the code to detect bit errors;

a second Exclusive-OR having a first input coupled to the data input and an output, the second Exclusive-OR for computing and presenting at its output an uncolored data portion;

a second module having a first input coupled to the output of the second Exclusive-OR and an output, the second module for producing at the output a check code;

an uncolored data output coupled to the second Exclusive-OR output; and an check code output coupled to the second module output.

35. The apparatus of claim 34, further comprising a storage device having a first output coupled to a second input of the second module, the storage device for storing a matrix to be multiplied with the data portion of the word.

36. The apparatus of claim 34, further comprising a storage device having a first output coupled to the second input of the second Exclusive-Or, the storage device for storing a packet identifier.

37. The apparatus of claim 34, further comprising a storage device having a first output coupled to the second input of the second Exclusive-Or, the storage device for storing the set of digits identifying the sequence position of the word.

38. The apparatus of claim 34, further comprising a storage device having a first output coupled to a second input of the second module, the storage device for storing a matrix to be multiplied with the code to detect word errors.

* * * * *